United States Patent
Hirano et al.

(10) Patent No.: US 6,912,161 B2
(45) Date of Patent: Jun. 28, 2005

(54) NONVOLATILE SEMICONDUCTOR MEMORY DEVICE

(75) Inventors: Yasuaki Hirano, Tenri (JP); Yasumichi Mori, Ikoma (JP); Shuichiro Kouchi, Tenri (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 10/611,643

(22) Filed: Jul. 2, 2003

(65) Prior Publication Data

US 2004/0130943 A1 Jul. 8, 2004

(30) Foreign Application Priority Data

Jul. 2, 2002 (JP) ........................................ 2002-193348

(51) Int. Cl.[7] .............................................. G11C 16/04
(52) U.S. Cl. .......................... 365/185.24; 365/185.01; 365/185.33
(58) Field of Search ...................... 365/185.24, 185.21, 365/185.33, 185.2, 185.01, 185.22, 185.18, 185.28

(56) References Cited

U.S. PATENT DOCUMENTS

| | | | | |
|---|---|---|---|---|
| 5,528,548 A | * | 6/1996 | Horiguchi et al. | .......... 365/226 |
| 6,072,724 A | | 6/2000 | Yamazaki et al. | |
| 6,075,738 A | * | 6/2000 | Takano | ....................... 365/210 |
| 6,466,480 B2 | * | 10/2002 | Pekny | ...................... 365/185.2 |
| 6,584,017 B2 | * | 6/2003 | Maayan et al. | ........ 365/185.22 |
| 6,768,689 B2 | * | 7/2004 | Origasa | ................. 365/189.11 |
| 2003/0002335 A1 | * | 1/2003 | Kwon | .................... 365/185.03 |

FOREIGN PATENT DOCUMENTS

JP          10-261768          9/1998

* cited by examiner

Primary Examiner—Richard Elms
Assistant Examiner—Dang T Nguyen
(74) Attorney, Agent, or Firm—Morrison & Foerster LLP

(57) ABSTRACT

In the nonvolatile semiconductor memory device of this invention, a program control circuit 1 sets the threshold value of a first reference cell RFC0 by means of a write circuit WC on the basis of a result of comparing the threshold value of the first reference cell RFC0 with the threshold value of a second reference cell SRC executed by a sense amplifier 8 for trimming. The compare of threshold values by the sense amplifier 8 for trimming can be executed within a shorter time than in the threshold value read operation of the first reference cell RFC0. Therefore, when the number of the first reference cells is increased, the threshold value adjustment time can be remarkably reduced in comparison with the prior art in which the threshold value of the first reference cell is adjusted by reading the first reference cell.

6 Claims, 11 Drawing Sheets

NONVOLATILE SEMICONDUCTOR MEMORY DEVICE

BACKGROUND OF THE INVENTION

The present invention relates to nonvolatile semiconductor memory devices, and in particular, to a nonvolatile semiconductor memory device capable of reducing a threshold value setting time of a reference cell.

Conventionally, as the flash memory used most generally, there is ETOX (EPROM Thin Oxide, which is a registered trademark of Intel). FIG. 13 shows a schematic sectional view of this ETOX type flash memory. In this memory, as shown in FIG. 13, a floating gate FG is formed between a source S and a drain D via a tunnel oxide film TF on a substrate, and a control gate CG is formed via an interlayer insulation film LF on this floating gate FG.

The principle of operation of the flash memory of this ETOX type will be described next. Table 1 provided below shows voltage conditions during write, erase and read operations. That is, during write, a voltage Vpp (9 V, for example) is applied to the control gate CG, the source S is made to have a reference voltage Vss (0 V, for example), and a voltage of 5 V is applied to the drain D. As a result, a large current flows through the channel layer, and hot electrons are generated in a portion of a high electric field on the drain side, so that electrons are injected into the floating gate FG, raising the threshold voltage. FIG. 14 shows this written state as a programmed state. In FIG. 14, the horizontal axis represents the threshold voltage, and the vertical axis represents the number N of memory cells.

TABLE 1

| | Application voltage in each mode | | | |
|---|---|---|---|---|
| | Control Gate | Drain | Source | Substrate |
| Write | 9 V | 5 V/Open | 0 V | 0 V |
| Erase | −9 V | Open | 6 V | 0 V |
| Read | 5 V | 1 V | 0 V | 0 V |

During erase, a voltage Vnn (−9 V, for example) is applied to the control gate CG, and a voltage Vpe (6 V, for example) is applied to the source S to extract electrons from the floating gate FG on the source side, lowering the threshold voltage. The threshold voltage in this erased state is shown in FIG. 14.

During this erase, a BTBT (Band To Band Tunneling) current flows. If this BTBT current is generated, then hot holes and hot electrons are generated at the same time. Among these, the hot electrons flow toward the substrate, while the hot holes are pulled toward the tunnel oxide film TF side and trapped in the oxide film TF. It is generally said that this phenomenon causes degraded reliability.

In the read operation, a voltage of 1 V is applied to the drain D, and a voltage of 5 V is applied to the control gate CG. At this time, the threshold voltage is in the erased state, and current flows through the memory cell when the threshold voltage is low. In this case, the stored information of this memory cell is determined to be "1". When the memory cell is in the programmed state and the threshold voltage is high, no current flows through the memory cell. In this case, the stored information of this memory cell is determined to be "0".

A read method in this case will be described more in detail referring to the construction of the sense amplifier circuit shown in FIG. 11. Normally, as shown in FIG. 11, the flash memory read operation is executed by comparing a current Im that flows through the memory cell (main cell) of a main array with a current Ir that flows through a reference cell and determining whether the data retained in the main cell is either "0" or "1".

In detail, it is determined that the above-mentioned data is "1" when Im>Ir, and it is determined that the data is "0" when Im<Ir. In order to thus make determination, the threshold value of the reference cell is required to be a value intermediate between the threshold value of the cell in the written state and the threshold value in the erased state. This intermediate value is, for example, 3.5 V.

The threshold value of this reference cell has conventionally been required to be an accurate value in consideration of reading speed, reliability and so on. For example, there is required an accuracy within 3.5 V±0.1 V. With regard to the word line voltage, both RWL and WL have same voltage (5 V, for example).

On the other hand, in the recent flash memories, reading speed is increased by high-speed access, a page-mode technique, a synchronous technique and so on. In particular, if the page mode technique and the synchronous technique are used, then the number of memory cells to be read through one-time read (sense) operation significantly increases. In this case, if it is attempted to achieve an increase in reading speed, then the state of the main cell and the state of the reference cell are required to be made as similar as possible during read. If it is attempted to satisfy this requirement, then the number of reference cells is to be disadvantageously increased.

For example, when the read operation is further increased in speed by using the page mode technique in the prior art, a sense system in the memory device has a construction as shown in FIG. 12. FIG. 12 shows a memory array in one block, which is constructed of 256 word lines WL0 through WL255 and 2048 bit lines BL0 through BL2032. Moreover, in the read operation, there is a construction in which 128 memory cells MS can be simultaneously read in one-time operation. On the other hand, in order to achieve high-speed read on the reference side, one reference cell RFC0 (,RFC1, . . . , RFC127) is arranged for one sense amplifier SA0 (,SA1, . . . , SA127).

Problems of the aforementioned conventional nonvolatile semiconductor memory device will be described next. FIG. 10 shows a circuit construction in which the threshold value of the reference cell of a reference cell array 103 is adjusted by programming (writing) the reference cell in the aforementioned memory device. The threshold value of the reference cell in this case is required to fall within the range of 3.5 V±0.1 V as described hereinabove. As a method for adjusting this threshold value, there is used a method for executing gradual programming by using an external controller and making the threshold value of one memory cell have a voltage of 3.5 V±0.1 V. This threshold value adjustment is executed during testing.

When the threshold value adjustment is executed, a command of the program operation of this reference cell is inputted from a program control circuit 101 to a sense amplifier array 105 and a reference cell word line voltage generator circuit 106. Then, one pulse of a program pulse is inputted from this sense amplifier array 105 and the reference cell word line voltage generator circuit 106 to the reference cell array 103. This program pulse is assumed to have, for example, a control gate voltage of 6 V, a drain voltage of 5 V and a pulse width of 1 µsec. Moreover, a gate voltage when this threshold value adjustment is executed is set at a value lower than that of normal program so as not to exceed the threshold value of the memory cell of the main array 102.

Next, a current, which flows directly from a pad PAD shown in FIG. 12 to the reference cell RFC0, is measured, and the threshold value is measured from the current. In this case, if it is determined that the threshold value is not higher than 3.4 V, then the program pulse is further applied to the reference cell RFC0. This threshold value adjustment operation is executed until the threshold value of the reference cell RFC0 comes to have a voltage of not lower than 3.4 V. The prior art of Japanese Patent Laid-Open Publication No. HEI 10-261768 also discloses a threshold value adjustment system like this.

If the threshold value adjustment of the reference cell RFC0 ends, then the threshold value adjustment of the reference cell RFC1 is executed. This threshold value adjustment operation is executed up to RFC127.

Next, a time required for the threshold value adjustment is examined. In the operation of adjusting the threshold value of one reference cell, the number of program pulses applied to one reference cell is normally required to be about 100 times. It is herein assumed that a time of 10 $\mu$sec is required for one program pulse apply operation (including setup operation and so on) and a time of 100 $\mu$sec is required for the threshold value read operation. Then, a time T required for the threshold value adjustment operation for one reference cell becomes about 11 msec as calculated by the following equation (101).

$$T = (100+10)\ \mu\text{sec} \times 100 = 11\ (\text{msec}) \tag{101}$$

Moreover, since there are 128 reference cells (RFC0 through RFC127), a total time TT required for the threshold value adjustment operation of these 128 reference cells RFC0 through RFC127 becomes about 1.4 sec as calculated by the following equation (102).

$$TT = 11\ \text{msec} \times 128 = 1.4\ (\text{sec}) \tag{102}$$

As described above, the time required for the threshold value adjustment of the reference cell (the time being also referred to as a testing time) becomes very long according to the aforementioned prior art.

Then, as described hereinabove, if the number of memory cells to be read through one-time read (sense) operation is significantly increased by the page mode technique and the synchronous technique, then the number of reference cells is also increased in accordance with this, disadvantageously increasing the threshold value adjustment time.

SUMMARY OF THE INVENTION

Accordingly, the object of the present invention is to provide a nonvolatile semiconductor memory device capable of reducing an increase in threshold value adjustment time due to an increase in the number of reference cells.

In order to achieve the aforementioned object, the nonvolatile semiconductor memory device of the present invention is provided with a memory cell constructed of a floating-gate field-effect transistor, which has a control gate, a drain, a source and a floating gate and is able to electrically execute write and erase of information, and a read means, which has a first reference cell. Moreover, in this nonvolatile semiconductor memory device, a threshold value comparing means compares the threshold value of a first reference cell with the threshold value of a second reference cell, and a threshold value setting means sets the threshold value of the first reference cell on the basis of a result of comparing the threshold values.

The above-mentioned compare of threshold values can be executed within a time shorter than that of the threshold value read operation of the first reference cell. Therefore, when the number of the first reference cells is increased, a threshold value adjustment time can be remarkably reduced in comparison with the prior art in which the threshold value of the first reference cell is adjusted by reading the first reference cell.

Moreover, in the nonvolatile semiconductor memory device of one embodiment, the threshold value comparing means has a second sense amplifier other than the first sense amplifier for reading the memory cell, and this second sense amplifier compares the threshold value of the first reference cell with the threshold value of the second reference cell. Therefore, the threshold value compare operation can be executed independently of the memory cell read operation.

In one embodiment of the present invention, the threshold value comparing means shares the sense amplifier owned by the read means as a sense amplifier for comparing the threshold value of the first reference cell with the threshold value of the second reference cell.

In this embodiment, the sense amplifier owned by the read means compares the threshold values of the first and second reference cells with each other. With this arrangement, dispersion of the sense amplifiers can be absorbed and threshold value adjustment accuracy can be improved, dissimilarly to the case where the sense amplifier for reading the main cell and the sense amplifier for comparing the threshold values are independently provided. Moreover, when a plurality of sense amplifiers for read are provided, it is also possible to simultaneously adjust the threshold values of a plurality of first reference cells, and the threshold value adjustment time can be reduced.

In one embodiment of the present invention, the nonvolatile semiconductor memory device comprises a plurality of second reference cells of different threshold values. Therefore, the threshold values of the plurality of first reference cells of different threshold values can be adjusted, and this can cope with memory cells that have threshold value states of multiple values beyond a binary value.

Moreover, in the nonvolatile semiconductor memory device of one embodiment, the target value of the threshold value of the first reference cell is between a threshold value in a written state in which the threshold value of the memory cell is raised and a threshold value in an erased state in which the threshold value of the memory cell is low, and the threshold value of the second reference cell is lower than the target value of the threshold value of the first reference cell. With this arrangement, as a result of comparing the threshold value of the first reference cell with the threshold value of the second reference cell by the threshold value comparing means, the threshold value setting means adds a write pulse to the first reference cell to increase the threshold value of the first reference cell and allow the threshold value to be put close to the target value of the threshold value when the threshold value of the first reference cell is lower than the threshold value of the second reference cell.

In one embodiment of the present invention, the threshold value of the second reference cell is lower than the target value of the threshold value of the first reference cell by a resolution of write of the threshold value setting means. Therefore, the threshold value setting means is able to set the threshold value of the first reference cell to the target value with a resolution accuracy of write on the basis of a result of comparing the threshold values by the threshold value comparing means.

In one embodiment of the present invention, the threshold value setting means is comprised of an internal control means for adjusting the threshold value of the first reference cell. Therefore, the threshold value of the first reference cell can be adjusted by internal control of the nonvolatile semiconductor memory device without depending on external control.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

Figure 1:
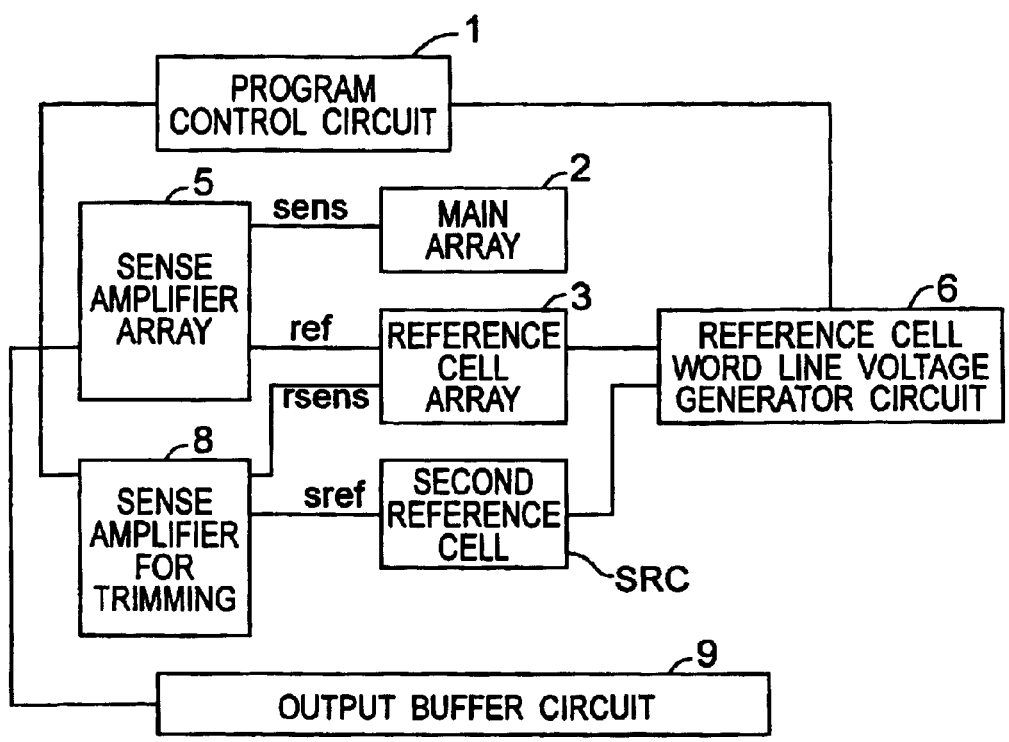
FIG. 1 is a block diagram showing the construction of a threshold value setting circuit for a reference cell of a nonvolatile semiconductor memory device according to a first embodiment of the present invention.

This invention will be described in detail below on the basis of the embodiments thereof shown in the drawings.

(First Embodiment)

The nonvolatile semiconductor memory device of the first embodiment of this invention will be described with reference to FIGS. 1 and 2.

As shown in FIG. 1, this first embodiment is provided with a program control circuit 1, a main array 2, a reference cell array 3 constructed of a plurality of first reference cells, a sense amplifier array 5, a reference cell word line voltage generator circuit 6, a second reference cell SRC, a sense amplifier 8 for reference trimming as the threshold value comparing means and an output buffer circuit 9.

As is apparent from FIG. 1, this embodiment has the second reference cell SRC and the sense amplifier 8 for reference trimming besides the reference cell array 3 and the sense amplifier array 5 for reading the main array 2. The second reference cell SRC and the sense amplifier 8 for reference trimming are used for adjusting the threshold value of the reference cell array 3 to a predetermined value. The sense amplifier 8 for reference trimming is a second sense amplifier.

Figure 2:
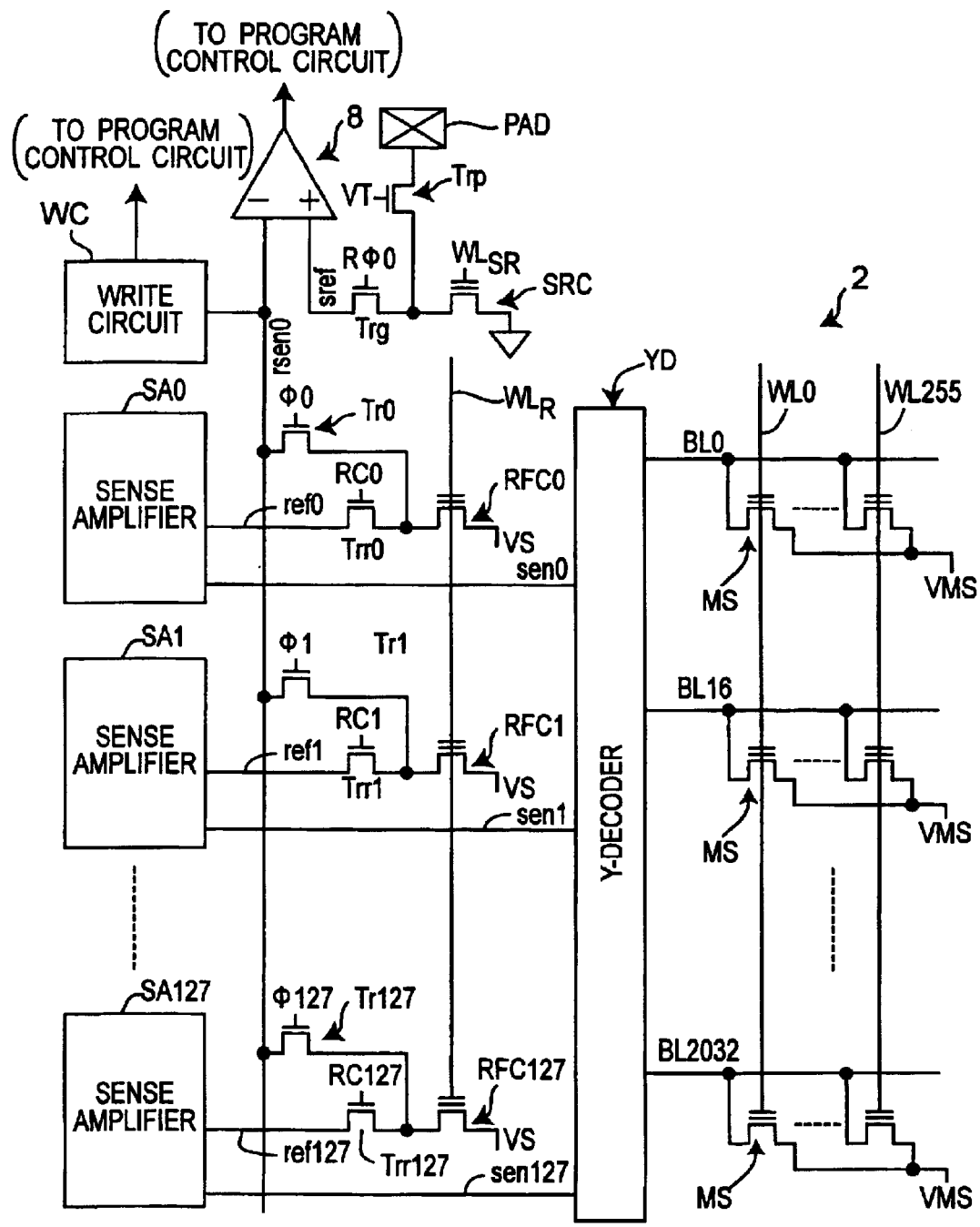
FIG. 2 is a schematic view of the threshold value setting circuit for the reference cell including a circuit of a sense system in the first embodiment.

As shown in FIG. 2, in the main array 2, a plurality of memory cells MS constructed of floating-gate field-effect transistors, which have floating gates and are able to electrically execute write and erase of information, are arranged in rows and columns. Word lines WL0 through WL255 as row lines are connected to the control gates of the memory cells MS of each row, and bit lines BL0 through BL2032 as column lines are connected to the drains of the memory cells MS of each column. The bit lines BL0 through BL2032 are connected to a Y-decoder YD. This Y-decoder YD is connected to 128 sense amplifiers SA0 through SA127 by way of 128 signal lines sen0 through sen127. These sense amplifiers SA0 through SA127 constitute the sense amplifier array 5. The signal lines sen0 through sen127 constitute a signal line group sens of FIG. 1.

Moreover, as shown in FIG. 2, the 128 first reference cells RFC0, RFC1 through RFC127, which are constructed of floating-gate field-effect transistors, constitute the reference cell array 3. The drains of these first reference cells RFC0, RFC1 through RFC127 are connected to sense amplifiers SA0, SA1 through SA127, respectively, by way of signal lines ref0 through ref127 via NMOS transistors Trr0, Trr1 through Trr127. The signal lines ref0 through ref127 of FIG. 2 constitute the signal line group ref of FIG. 1, and the signal line rsen0 of FIG. 2 is the signal line rsens of FIG. 1.

Moreover, as shown in FIG. 2, a write circuit WC is connected to the signal line rsen, and this signal line rsen is connected to the drains of the first reference cells RFC0, RFC1 through RFC127 via transistors Tr0, Tr1 through Tr127. The write circuit WC is connected to the program control circuit 1 of FIG. 1. This program control circuit 1 and the write circuit WC constitute the threshold value setting means.

Further, the signal line rsen is connected to the inverted input terminal of the sense amplifier 8 for trimming, and the output terminal of this sense amplifier 8 for trimming is connected to the program control circuit 1. The noninverted input terminal of this sense amplifier 8 for trimming is connected to the drain of the second reference cell SRC constructed of a floating-gate field-effect transistor via an NMOS transistor Trg by way of a signal line sref. The drain of this second reference cell SRC is connected to an external pad PAD via an NMOS transistor Trp. The control gate of the second reference cell SRC is connected to a second reference word line $WL_{SR}$. The source of this second reference cell SRC is connected to a terminal supplied with a source voltage.

Circuit operation of this first embodiment will be described next. Reference is first made to a method for setting the threshold value of the second reference cell SRC.

In this case, the target value of the threshold value of the first reference cells RFC0 through RFC127 for read owned by the reference cell array 3 is 3.5 V, and therefore, the threshold value of the second reference cell SRC is set within a range of 3.45 V±0.05 V. That is, the threshold value of the second reference cell SRC is set lower than the target value of the threshold value of the first reference cells RFC0 through RFC127. The reason for the above is that the threshold value of the first reference cell is set by applying the program pulse one by one to the first reference cells RFC0 through RFC127 and raising in steps the threshold value of the first reference cells while detecting the threshold value of the first reference cell by comparison with the threshold value of the second reference cell.

Therefore, by setting the threshold value of the second reference cell SRC lower than the threshold value of the first reference cell by the threshold value (resolution of write) raised by applying one program pulse to the first reference cells RFC0 through RFC127, the threshold value of the first reference cells RFC0 through RFC127 can be set in the neighborhood of the target value (3.5 V).

The above is because the application of the program pulse to the first reference cells is ended when it is detected that the threshold value of the first reference cells RFC0 through RFC127 becomes higher than the threshold value of the second reference cell SRC. That is, when the threshold value of the second reference cell SRC is set at the same value as the threshold value of the first reference cells, the threshold value of the first reference cell is disadvantageously set higher than the threshold value of the second reference cell.

According to the program method of this first embodiment, a drain voltage is inputted from the external pad PAD shown in FIG. 2 to the second reference cell SRC via the transistor Trp. Moreover, a word line voltage is supplied from the reference cell word line voltage generator circuit 6 of FIG. 1 to the second reference word line WLSR, and a control gate voltage is applied to the control gate of the second reference cell SRC. It is to be noted that the drain voltage to the second reference cell SRC may be generated by an internal circuit. It is also acceptable to input the word line voltage from the external pad.

As described above, the program pulse is inputted by one pulse to the second reference cell SRC. This program pulse has, for example, a control gate voltage of 6 V, a drain voltage of 5 V and a pulse width of 1 µsec.

Reference is next made to the read operation of the threshold value. Also, in this read operation, a voltage is inputted directly to the drain of the second reference cell SRC from the external pad PAD shown in FIG. 2 via the bit line. The control gate voltage to the second reference word line WL$_{SR}$ is inputted directly from an external pad (not shown). In this state, a current flowing through the second reference cell SRC is measured, and the threshold value of the second reference cell SRC is measured. If it is determined that this measured threshold value is not higher than 3.4 V, then the program pulse is further applied to the second reference cell SRC. The operations of threshold value measurement, determination and pulse application are repeated until the threshold value of the second reference cell SRC becomes equal to or higher than 3.4 V. Consequently, the threshold value of the second reference cell SRC is set within a range of 3.4 V to 3.5 V.

Reference is next made to the threshold value setting operation of the first reference cells RFC0 through RFC127 that constitute the reference cell array 3 and used for reading the main array 2 shown in FIG. 1. In this embodiment, as shown in FIG. 2, there are 128 first reference cells RFC0 through RFC127. During the threshold value setting of these first reference cells RFC0 through RFC127, the threshold value is adjusted by alternately executing write and verify.

Figure 7:
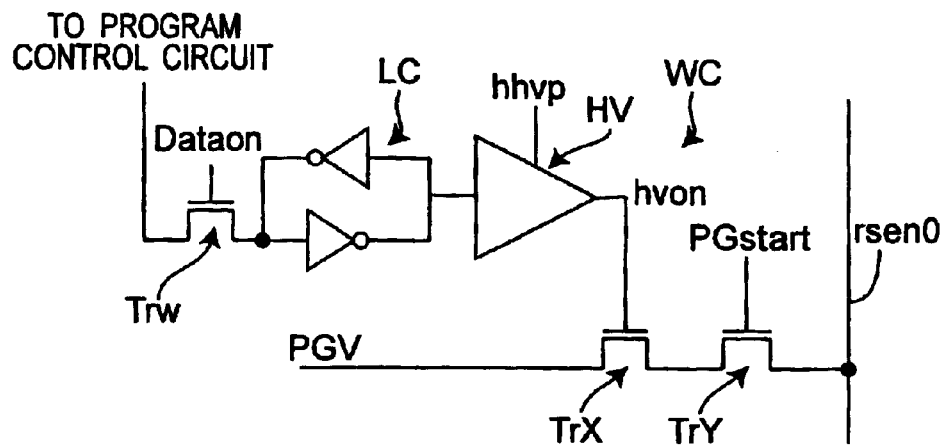
FIG. 7 is a circuit diagram of a write circuit in the first embodiment.

FIG. 7 shows the construction of the write circuit WC of FIG. 2. If a program operation start signal is inputted to the program control circuit 1 of FIG. 1, then L (low) level is outputted as a write signal from the program control circuit 1 to the write circuit WC. If the signal Dataon shown in FIG. 7 goes H (high) level, then the NMOS transistor TrW is turned on to latch L level in a latch circuit LC. Then, a signal hhvp comes to have a high voltage (10 V, for example), as a consequence of which an output signal hvon of a level shifter HV comes to have a voltage of 10 V to turn on an NMOS transistor TrX. On the other hand, a signal PGV comes to have a program voltage (5 V, for example), and a signal PGstart goes H level (10 V, for example) to turn on an NMOS transistor TrY, outputting a voltage of 5 V to the signal line rsen0.

Further, the voltage Φ0 shown in FIG. 2 goes H level (10 V, for example), and the NMOS transistor Tr0 is turned on to output a voltage of 5 V to the drain of the first reference cell RFC0 from the write circuit WC via the signal line rsen0 and the NMOS transistor Tr0. At this time, the reference word line WL$_R$ comes to have a voltage (about 5.5 V, for example) lower than the voltage in the normal program (write) stage to start the program (write), and the threshold value of the first reference cell RFC0 rises. The program pulse width during this program is about 1 µsec.

Next, the program control circuit 1 outputs an instruction of verify operation. As a result, the verify operation is started. During this verify operation, compare of threshold values is executed by using the second reference cell SRC, which has previously undergone threshold value adjustment, and the sense amplifier 8 for trimming. That is, during this verify operation, the threshold value of the first reference cell RFC0 and the threshold value of the second reference cell SRC are compared with each other. During this verify operation, a signal RΦ0 is made to go H level to turn on the transistor Trg, and the signal Φ0 is made to go H level to turn on the transistor Tr0. A voltage within a range of the threshold voltage of the second reference cell SRC to this threshold voltage plus a voltage of not higher than 3 V is applied to the second reference word line WL$_{SR}$ and the first reference word line WL$_R$. A voltage equal to the word line voltage to the second reference word line WL$_{SR}$ is applied to the word line WL$_R$ of the first reference cell RFC0.

In this case, if the threshold value of the first reference cell RFC0 is lower than the threshold value of the second reference cell SRC, then the voltage inputted to the noninverted input terminal of the sense amplifier 8 for trimming from the second reference cell SRC via the signal line sref is higher than the voltage inputted to the inverted input terminal of the sense amplifier 8 for trimming from the first reference cell RFC0 via the signal line rsen0.

In this case, the program control circuit 1, which has received an output signal from the sense amplifier 8 for trimming, controls the write circuit WC and the reference cell word line voltage generator circuit 6 to apply again the program pulse by one pulse to the first reference cell RFC0, raising the threshold value of the first reference cell RFC0 by a predetermined value. Then, the verify operation is executed again. Consequently, if the threshold value of the first reference cell RFC0 is still lower than the threshold value of the second reference cell SRC, then the program pulse is further applied by one pulse to the first reference cell RFC0.

Then, this verify operation and the program pulse application are repeated. If the threshold value of the first reference cell RFC0 finally becomes higher than the threshold value of the second reference cell SRC, then the output signal from the sense amplifier 8 for trimming to the program control circuit 1 goes L level. As a result, the program control circuit 1 determines that the threshold value of the first reference cell RFC0 is higher than the threshold value of the second reference cell SRC and ends the program pulse application to the first reference cell RFC0.

The aforementioned threshold value adjustment operation (verify and program pulse application) is automatically executed by the internal program control circuit 1 until the threshold value of the first reference cell RFC0 becomes equal to or higher than the predetermined threshold value if the program control circuit 1 once issues a command.

Subsequently, the aforementioned threshold value adjustment operation is executed in the order of first reference cell RFC1, first reference cell RFC2, ..., first reference cell RFC127. In this case, assuming that the threshold value adjustment of one first reference cell requires a time of 10 μsec for the program pulse application operation (including setup operation and so on) and a time of 2 μsec for the verify and that the number of program pulses to be applied is 100, then a time T required for the threshold value adjustment operation of one first reference cell becomes about 1.2 msec as calculated by the following equation (1).

$$T=12 \text{ (}\mu\text{sec)} \times 100 \text{ (times)}=1.2 \text{ (msec)} \tag{1}$$

Moreover, assuming that a time required for the program control circuit 1 to first issue once the command to adjust the threshold value of one first reference cell is about 1 μsec, since the number of the first reference cells is 128, then a total time TT required for adjusting the threshold values of these 128 first reference cells becomes about 0.15 sec according to the following equation (2).

$$TT=1.201 \text{ (msec)} \times 128 \text{ (pcs)}=0.15 \text{ (sec)} \tag{2}$$

Therefore, in contrast to the fact that a time of 1.4 sec is required for the adjustment of the threshold values in the prior art case (refer to the equation (101)), the threshold value adjustment time can be reduced to about one tenth according to this first embodiment in comparison with the prior art.

In this first embodiment, with regard to one second reference cell SRC, the threshold value was set by measuring a current flowing through the cell. On the other hand, with regard to the 128 first reference cells RFC0 through RFC127, by setting the threshold value through compare (verify) of threshold values with that of the second reference cell SRC by means of the sense amplifier 8 used as the voltage comparing means, the time required for the threshold value adjustment was able to be remarkably reduced in comparison with the conventional case.

Therefore, according to this first embodiment, it is possible to suppress an increase in the threshold value adjustment time as a consequence of an increase in the number of the first reference cells by the threshold value adjustment operation controlled by the internal program control circuit 1.

(Second Embodiment)

The nonvolatile semiconductor memory device of the second embodiment of the present invention will be described next with reference to FIGS. 3 and 4.

In the aforementioned first embodiment, there is one sense amplifier 8 for use in adjusting the threshold value of the first reference cells RFC0 through RFC127, and therefore, the threshold value adjustment of the first reference cells is to be executed one by one, and the verify time and the program time become long when the number of the first reference cells is further increased. Furthermore, the sense amplifiers SA1 through SA127 for use in reading the main array 2 differ from the sense amplifier 8 for use in setting the threshold values of the first reference cells RFC0 through RFC127, and therefore, the dispersion among the sense amplifiers cannot be absorbed. This second embodiment is obtained by improving this point.

Figure 3:
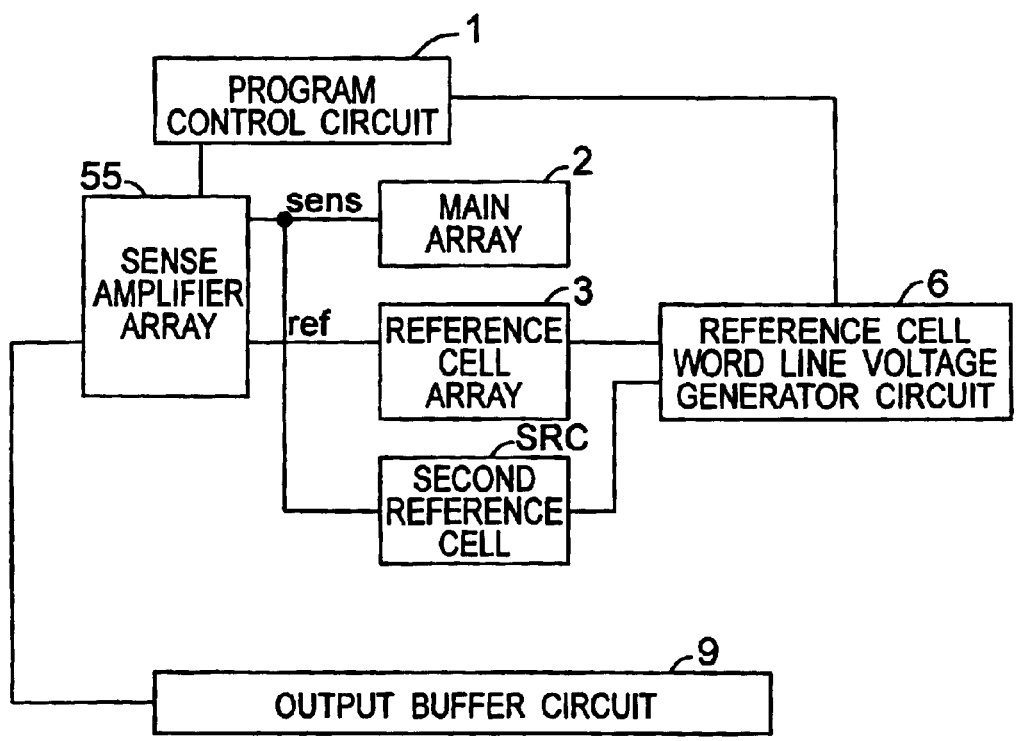
FIG. 3 is a block diagram showing the construction of a threshold value setting circuit for a reference cell according to a second embodiment of the present invention.
Figure 4:
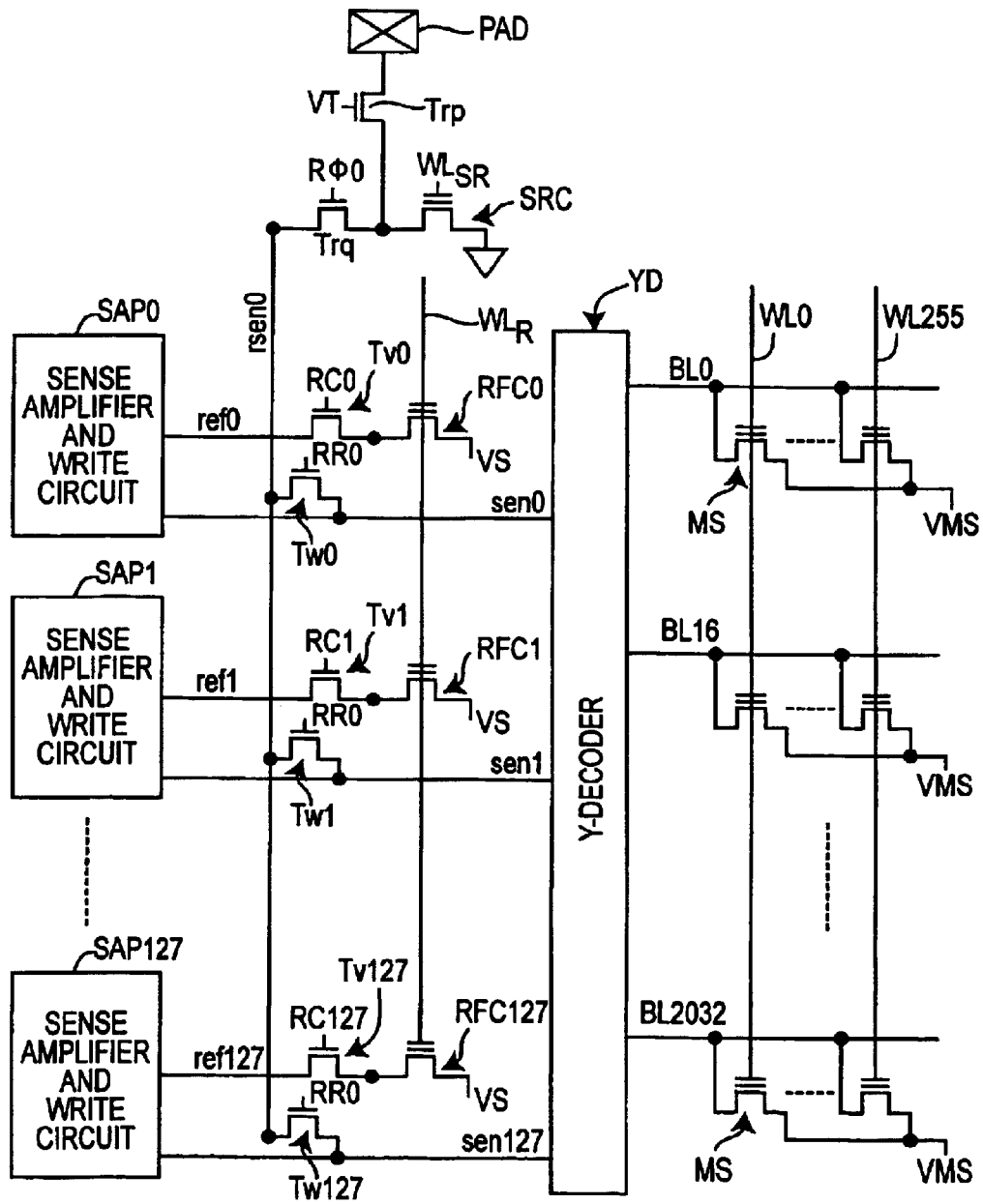
FIG. 4 is a schematic view of the threshold value setting circuit of the reference cell including a circuit of a sense system in the second embodiment of the present invention.

As shown in FIGS. 3 and 4, this second embodiment differs from the first embodiment in that there is no sense amplifier 8 for trimming, which has been owned by the first embodiment shown in FIGS. 1 and 2, and a sense amplifier array 55 is provided in place of the sense amplifier array 5. As shown in FIG. 4, this sense amplifier array 55 is constructed of 128 sense amplifier and write circuits SAP0 through SAP127.

Figure 8:
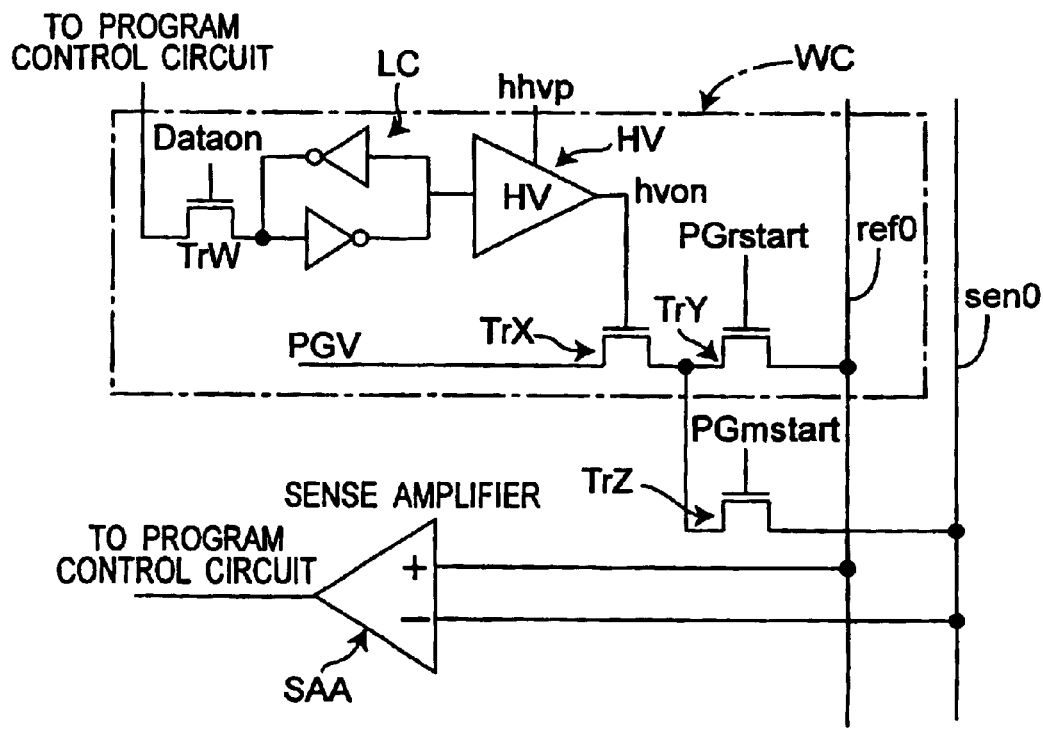
FIG. 8 is a circuit diagram of a sense amplifier and write circuit in the second embodiment.

FIG. 8 shows the construction of the sense amplifier and write circuit SAP0 of FIG. 4. This sense amplifier and write circuit SAP0 is constructed of a sense amplifier SAA and a write circuit WC. This write circuit WC has a construction similar to that of the write circuit WC of FIG. 7. The construction of this sense amplifier and write circuit SAP0 is the same as the construction of other sense amplifier and write circuits SAP1 through SAP127.

Moreover, these sense amplifier and write circuits SAP0 through SAP127 are connected to the drains of the first reference cells RFC0 through RFC127 via signal lines ref0 through ref127 and NMOS transistors Tv0 through Tv127. These sense amplifier and write circuits SAP0 through SAP127 are connected to a Y-decoder YD by way of signal lines sen0 through sen127. The signal lines sen0 through sen127 are connected to a signal line rsen0 by way of NMOS transistors Tw0 through Tw127. This signal line rsen0 is connected to the drain of a second reference cell SRC via an NMOS transistor Trq. The drain of this second reference cell SRC is connected to an external pad PAD via an NMOS transistor Trp.

In this second embodiment, the sense amplifier SAA owned by the sense amplifier and write circuits SAP1 through SAP127 constitutes the threshold value comparing means, while the write circuit WC and the program control circuit 1 constitute the threshold value setting means.

Circuit operation of this second embodiment will be described next. Reference is first made to a method for setting the threshold value of the second reference cell SRC. In this case, the target value of the threshold value of the first reference cells RFC0 through RFC127 is 3.5 V, and therefore, the threshold value of the second reference cell SRC is set within a range of 3.45 V±0.05 V. A method for programming the second reference cell SRC in this case is to input a drain voltage from the external pad PAD to the drain of the second reference cell SRC and supply an application voltage from the reference cell word line voltage generator circuit 6 to the second reference word line $WL_{SR}$. It is acceptable to generate the drain voltage in an internal circuit. It is also acceptable to input the word line voltage to the word line $WL_{SR}$ from an external pad.

A program pulse is inputted by one pulse to the second reference cell SRC by the drain voltage and the word line voltage. For example, a voltage of 6 V is applied as a gate voltage to the control gate of the second reference cell SRC by, for example, the word line voltage, and a voltage of 5 V is applied to the drain of the second reference cell SRC by the drain voltage. The pulse width of the program pulse is set at, for example, 1 μsec.

Reference is next made to the threshold value read operation of the second reference cell SRC. During this read operation, a voltage is inputted directly from the external pad PAD shown in FIG. 4 to the bit line connected to the drain of the second reference cell SRC. A voltage to the second reference word line $WL_{SR}$ is inputted directly from an external pad (not shown), a current flowing through the second reference cell SRC is measured, and the threshold value is measured from the current value.

If it is determined that the threshold value of the second reference cell SRC is not higher than 3.4 V as a result of this measurement, then the program pulse is further applied by one pulse to the second reference cell SRC. The operations of threshold value measurement, threshold value determination and pulse application are repeated until the threshold value of the second reference cell SRC becomes equal to or higher than 3.4 V. Consequently, the threshold value of the second reference cell SRC is set within a range of 3.4 V to 3.5 V.

Reference is next made to the threshold value setting operation of the first reference cells RFC0 through RFC127 for use in reading the main array 2 constructed of a plurality of main memory cells MS. As shown in FIG. 4, 128 first reference cells RFC0 through RFC127 constitute the reference cell array 3.

During the threshold value setting operation of these first reference cells RFC0 through RFC127, the threshold value of the first reference cell is adjusted as follows by alternately executing write and verify in the first reference cell.

(Write into First Reference Cell)

When a program operation start signal is inputted to the program control circuit 1 shown in FIG. 3, then L level is outputted as a write signal from the program control circuit 1 to the write circuit WC of FIG. 8. Subsequently, the signal Dataon shown in FIG. 8 goes H level to turn on the NMOS transistor TrW, and L level is latched in the latch circuit LC. Then, the signal hhvp comes to have a high voltage (10 V, for example), as a consequence of which the output signal hvon of the level shifter HV comes to have a voltage of 10 V to turn on the NMOS transistor TrX. Then, the signal PGV comes to have a program voltage (5 V, for example), and the signal PGrstart goes H level (10 V, for example) to turn on the transistor TrY, outputting a voltage of 5 V to the signal line ref0.

Further, a signal RC0 in FIG. 4 goes H level (10 V, for example) to turn on the transistor Tv0, and a voltage of 5 V is outputted from the signal line ref0 to the drain of the reference cell RFC0. A voltage (about 5.5 V, for example) lower than the voltage in the normal program stage is applied as a voltage supplied to the first reference cell word line $WL_R$ to start program (write), as a consequence of which the threshold value of the first reference cell RFC0 rises. It is assumed that the program pulse, which is constructed of the voltage to the drain and the voltage from the word line $WL_R$ to the control gate, has a pulse width of about 1 μsec.

The write operation into these first reference cells RFC0 through RFC127 can be simultaneously executed by using eight sense amplifier and write circuits SAP0 through SAP7 for, for example, eight first reference memory cells RFC0 through RFC7. That is, the eight first reference memory cells RFC0 through RFC7 can be subjected to parallel write from the eight sense amplifier and write circuits SAP0 through SAP7.

Next, the program control circuit 1 outputs an instruction of verify operation. As a result, the verify operation is started. During this verify operation, compare of threshold values of the first reference cells RFC0 through RFC127 with the second reference cell SRC is executed by using the second reference cell SRC, which has previously undergone threshold value adjustment, and the sense amplifier SAA of FIG. 8.

This compare of threshold values can be simultaneously executed for the eight first reference cells RFC0 through RFC7 by using the eight sense amplifiers SAA of the eight sense amplifier and write circuits SAP0 through SAP7.

For example, if the threshold value of the first reference cell RFC0 among the eight first reference cells RFC0 through RFC7 is lower than the threshold value of the second reference cell SRC, then the voltage inputted to the inverted input terminal of the sense amplifier SAA from the second reference cell SRC via the signal line rsen0, the transistor Tw0 and the signal line sen0 is higher than the voltage inputted to the noninverted input terminal of the sense amplifier SAA from the first reference cell RFC0 via the signal line ref0.

Then, the sense amplifier SAA of FIG. 8 outputs a signal to the program control circuit 1, and the program control circuit 1 determines that the threshold value of the first reference cell RFC0 is lower than the threshold value of the second reference cell SRC and executes the operation of write into the first reference cell. As a result, the program pulse is applied again to this first reference cell RFC0.

The compare of threshold values and the program pulse application are repeated, and finally, the threshold value of the first reference cells RFC0 through RFC7 becomes higher than the threshold value of the second reference cell SRC. Consequently, when the program control circuit 1, which has received the output signal of the sense amplifier SAA, determines that the threshold value of the first reference cells RFC0 through RFC7 is higher than the threshold value of the second reference cell SRC, pulse application to the first reference cells RFC0 through RFC7 ends.

The threshold value adjustment operation of the first reference cells RFC0 through RFC7 is automatically executed by using the internal program control circuit 1 until the threshold value of the first reference cells RFC0 through RFC7 becomes equal to or higher than the predetermined threshold value (threshold value of the second reference cell SRC) if the program control circuit 1 once issues a command.

Subsequently, threshold value adjustment is executed in groups of eight in the order of first reference cell RFC8 through first reference cell RFC15, . . . , and first reference cell RFC120 through first reference cell RFC127. In this case, assuming that the number of program pulses is 100, a time of 10 μsec is required for the program pulse applying operation (including setup operation and so on) and a time of 2 μsec is required for verify with regard to the threshold value setting time of the eight first reference cells, then a time T required for the threshold value adjustment operation of the eight first reference cells becomes about 1.2 msec according to the following equation (3).

$$T=((12)\ \mu\text{sec} \times 100)=1.2\ \text{msec} \tag{3}$$

Moreover, in order to adjust the eight first reference cells, a command is issued once first. Since there are 128 first reference cells, assuming that a time required for the above operation is 1 μsec, then a total time TT required for the threshold value adjustment in simultaneously executing the threshold value adjustment of the eight first reference cells as described above becomes about 0.039 sec according to the following equation (4).

$$TT=1.201\ \text{msec} \times 128/8 = 0.039\ \text{sec} \tag{4}$$

Thus, according to this second embodiment, the time required for executing the threshold value adjustment of the first reference cells RFC0 through RFC127 can be reduced to about ⅛ in comparison with the first embodiment.

Moreover, in this second embodiment, an NMOS transistor TrZ is turned off by a signal PGmstart in FIG. 8, and NMOS transistors Tw0 through Tw127 are turned off by a signal RR0 to read the memory cell MS of the main array 2 by means of the sense amplifier SAA of the sense amplifier and write circuits SAP0 through SAP127. That is, in this second embodiment, the identical sense amplifier SAA is used during the read of the main array 2 and during the threshold value setting of the first reference cells RFC0 through RFC127. Therefore, dispersion between the sense amplifiers can be absorbed in comparison with the case where different sense amplifiers are used during read and during threshold value setting.

(Third Embodiment)

The nonvolatile semiconductor memory device of the third embodiment of the present invention will be described next with reference to FIGS. 5 and 6.

Figure 15:
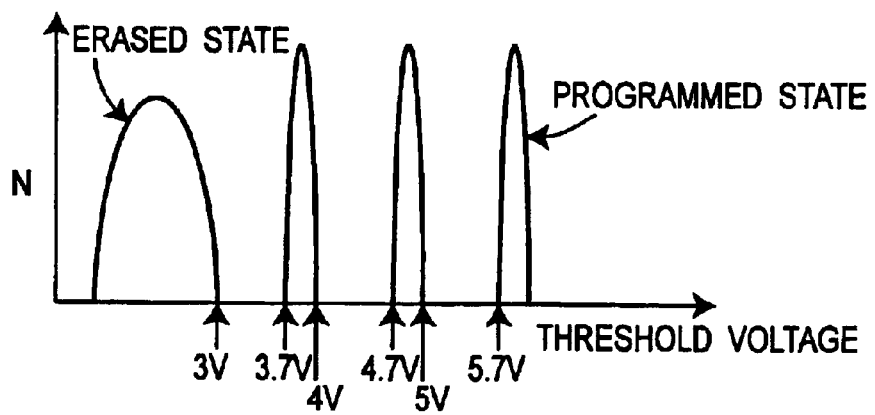
FIG. 15 is a graph showing the electric charge state of the floating gate of a four-valued flash memory.

In the aforementioned first and second embodiments, the nonvolatile semiconductor memory is the binary flash memory. On the other hand, multivalued flash memories are recently examined for bit cost reduction in various places. For example, in the case of a four-valued flash memory, there are four states of the threshold value of one memory cell as shown in FIG. 15. In this case, three reference cells are required for separation among the threshold value states, and the reference cells are further increased in number.

Accordingly, in this third embodiment, the case where the present invention is applied to the multivalued flash memory will be described.

Figure 5:
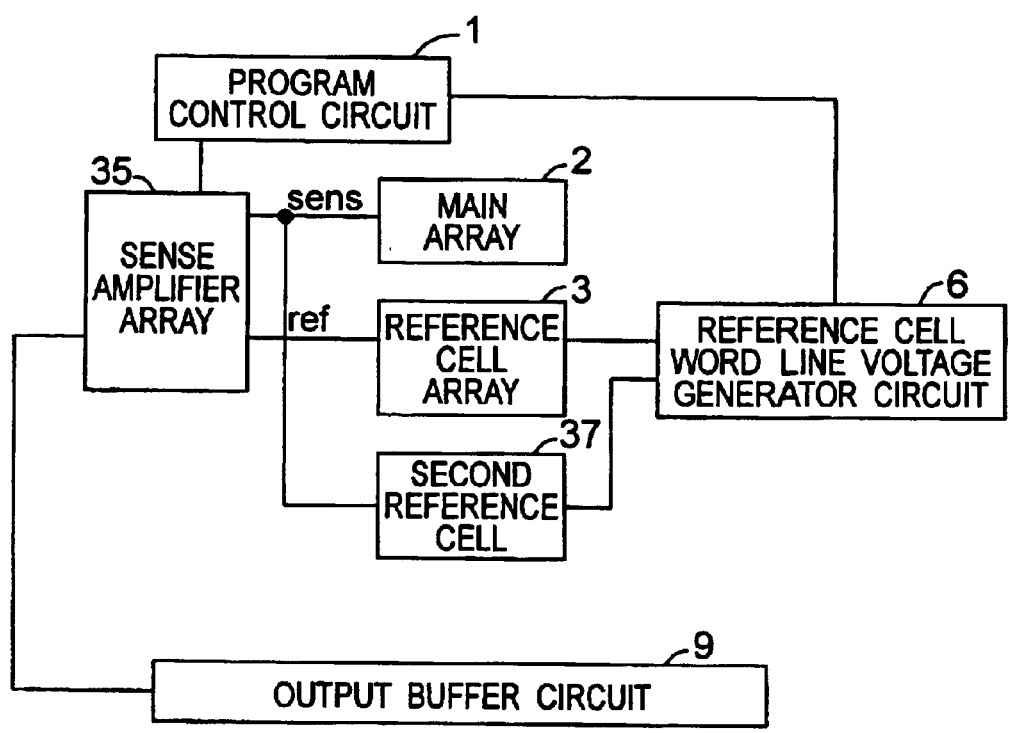
FIG. 5 is a block diagram showing the construction of a threshold value setting circuit for a reference cell according to a third embodiment of the present invention.

As shown in FIG. 5, the threshold value setting circuit of the reference cells of this third embodiment is provided with a sense amplifier array 35 in place of the sense amplifier array 55 of the second embodiment shown in FIG. 3 and provided with a second reference cell array 37 in place of the second reference cell SRC of FIG. 3.

Figure 6:
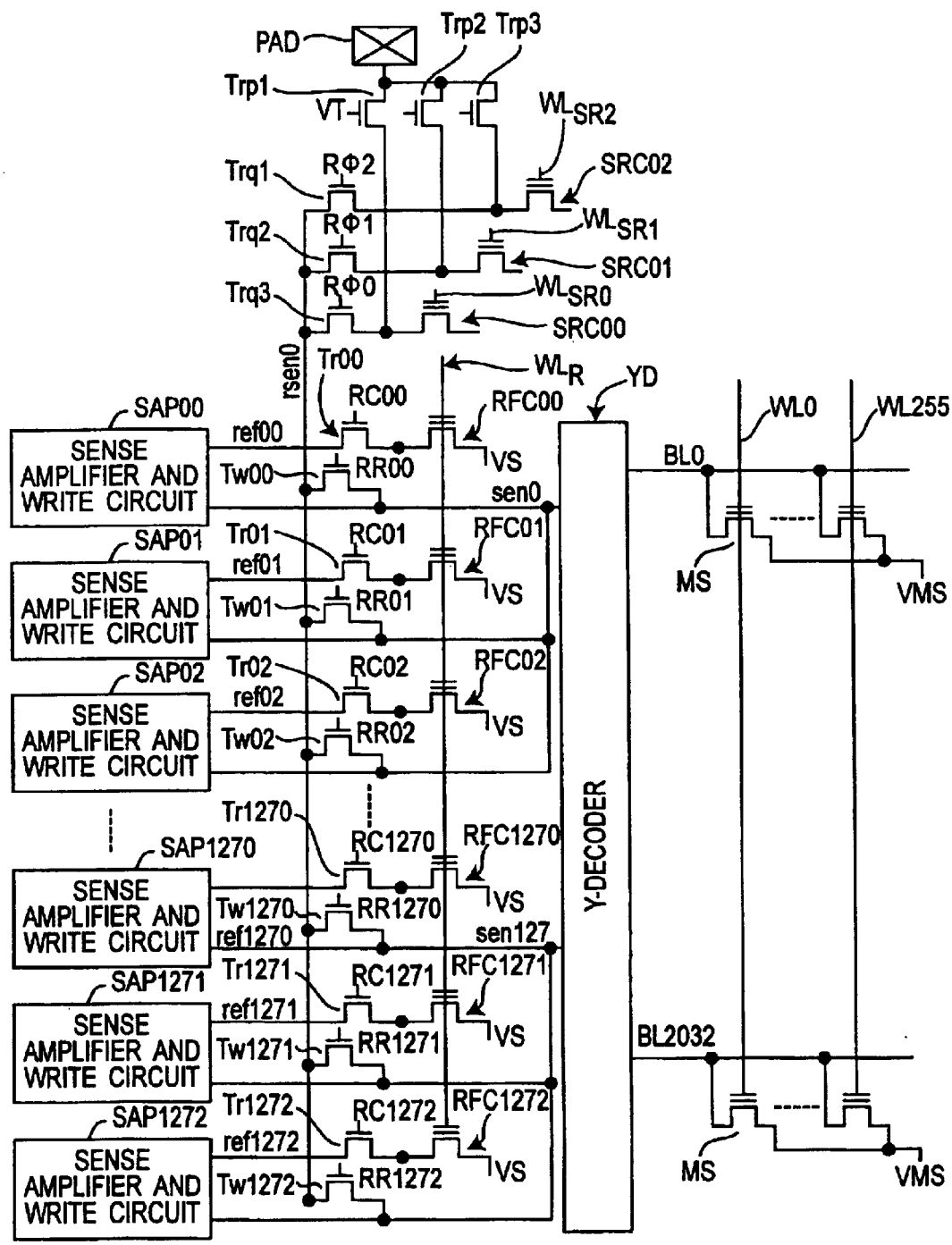
FIG. 6 is a schematic view of the threshold value setting circuit for the reference cell including a circuit of a sense system in the third embodiment.

This sense amplifier array 35 is constructed of sense amplifier and write circuits SAP00 through SAP1272 shown in FIG. 6. The second reference cell array 37 is constructed of second reference cells SRC00, SRC01 and SRC02. These three second reference cells SRC00, SRC01 and SRC02 have their drains connected to an external pad PAD via NMOS transistors Trp1, Trp2 and Trp3, respectively. The drains of the second reference cells SRC00, SRC01 and SRC02 are connected to a signal line rsen0 via NMOS transistors Trq3, Trq2 and Trq1, respectively. The control gates of the second reference cells SRC00, SRC01 and SRC02 are connected to word lines $WL_{SR0}$, $WL_{SR1}$ and $WL_{SR2}$. The sources of the second reference cells SRC00 through SRC02 are connected to a terminal supplied with a source voltage.

Figure 9:
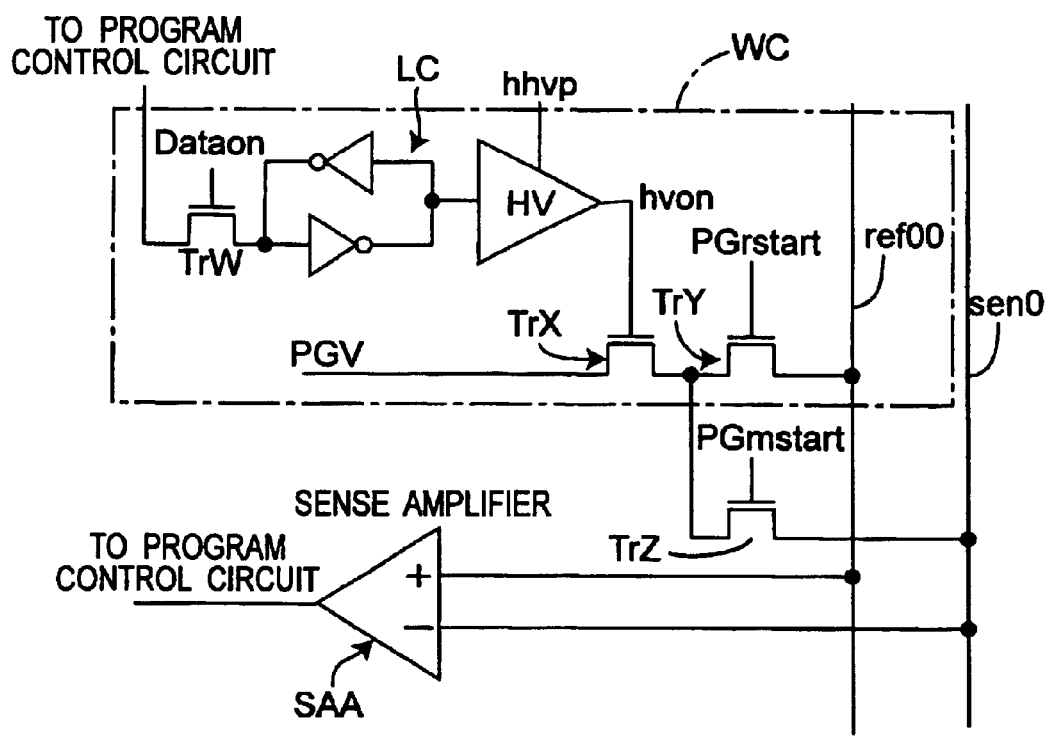
FIG. 9 is a circuit diagram of a sense amplifier and write circuit in the third embodiment.
Figure 10:
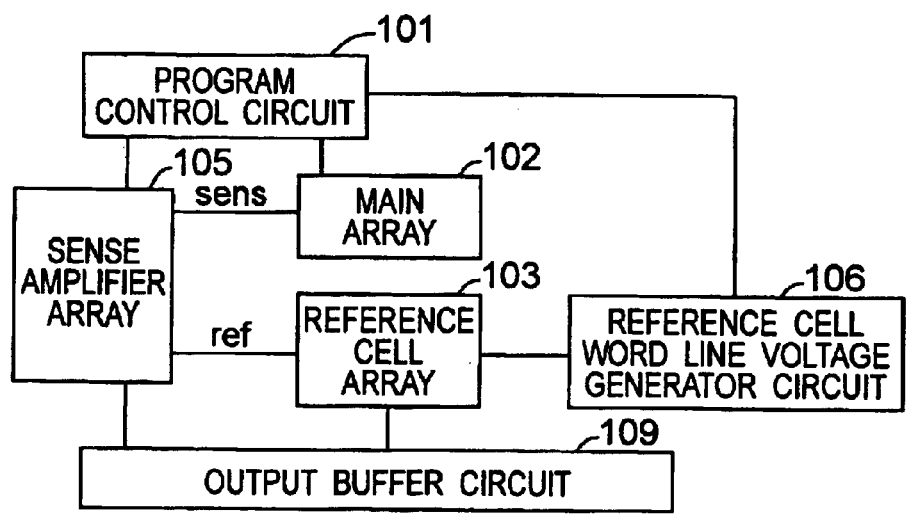
FIG. 10 is a block diagram showing the construction of a threshold value setting circuit for a reference cell according to a background art.
Figure 11:
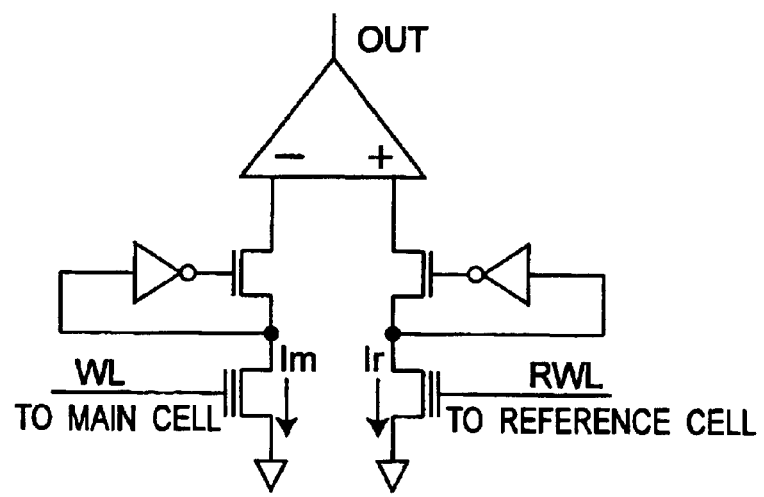
FIG. 11 is a circuit diagram showing the construction of a sense amplifier circuit of a background art.
Figure 12:
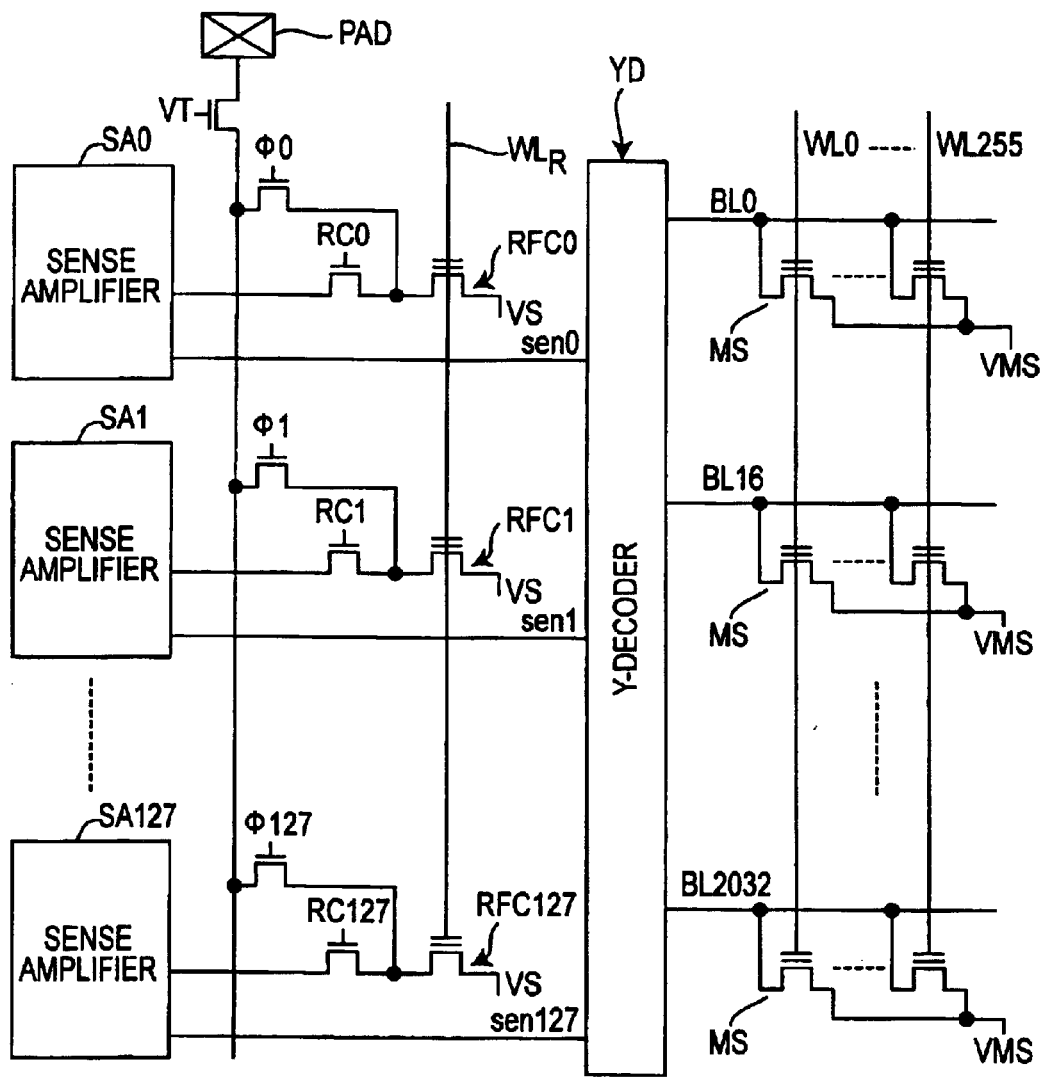
FIG. 12 is a schematic view of a threshold value setting circuit for a reference cell including a circuit of a sense system in the background art.
Figure 13:
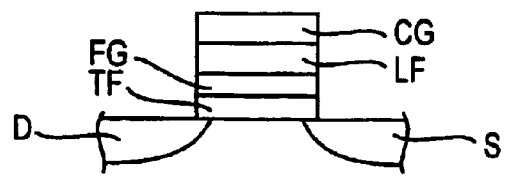
FIG. 13 is a view showing the cross-sectional structure of a flash memory.
Figure 14:
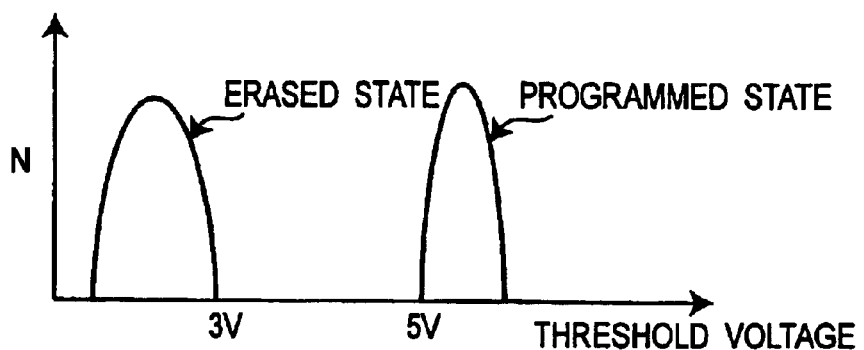
FIG. 14 is a graph showing the electric charge state of the floating gate of a binary flash memory.

FIG. 9 shows the construction of the sense amplifier and write circuit SAP00 of FIG. 6. The construction of this sense amplifier and write circuit SAP00 is similar to the construction of the sense amplifier and write circuit SAP0 of FIG. 8 of the second embodiment.

As shown in FIG. 6, this third embodiment is provided with 128 sense amplifier and write circuits SAP00 through SAP1270, 128 sense amplifier and write circuits SAP01 through SAP1271 and 128 sense amplifier and write circuits SAP02 through SAP1272. That is, this third embodiment has 128×3 sense amplifier and write circuits SAP00 through SAP1272. A sense amplifier SAA owned by these sense amplifier and write circuits SAP00 through SAP1272 constitutes the threshold value comparing means. The write circuit WC owned by the sense amplifier and write circuits SAP00 through SAP1272 and the program control circuit 1 constitute the threshold value setting means.

The sense amplifier and write circuits SAP00, SAP01, SAP02 through SAP1270, SAP1271 and SAP1272 are connected to the drains of first reference cells RFC00, RFC01, RFC02 through RFC1270, RFC1271 and RFC1272, respectively, via signal lines ref00, ref01, ref02 through ref1270, ref1271, ref1272 and NMOS transistors Tr00, Tr01, Tr02 through Tr1270, Tr1271 and Tr1272.

Circuit operation of this third embodiment will be described next. Reference is first made to a method for setting the threshold value of three second reference cells SRC00 through SRC02. First of all, since the target value of the threshold value of the first reference cell RFC00 is 3.5 V, the threshold value of the second reference cell SRC00 is set within a range of 3.45 V±0.05 V. A program (write) method in this case is to input a drain voltage to the second reference cell SRC00 from the external pad PAD via the transistor Trp1 and supply an application voltage to the second reference word line $WL_{SR0}$ from the reference cell word line voltage generator circuit 6. It is acceptable to generate the drain voltage in an internal circuit. It is also acceptable to input the application voltage to the word line $WL_{SR0}$ from an external pad.

During write into this second reference cell SRC00, a program pulse (having, for example, a control gate voltage of 6 V, a drain of 5 V and a pulse width of 1 μsec) is inputted by one pulse to the second reference cell SRC00.

Reference is next made to the read of the threshold value of this second reference cell SRC00. A voltage to the bit line connected to the drain of the second reference cell SRC00 is inputted from the external pad PAD shown in FIG. 6 via the transistor Trp1. A voltage to the second reference word line $WL_{SR0}$ is inputted directly from an external pad (not shown), a cell current flowing through the second reference cell SRC00 is measured, and the threshold value is measured from the current.

If it is determined that the threshold value of the second reference cell SRC00 is not higher than 3.4 V as a result of this threshold value measurement, then the program pulse is further applied to the second reference cell SRC00. The threshold value measurement and program pulse applying operations are executed until the threshold value of the second reference cell SRC00 come to have a voltage of not lower than 3.4 V. Consequently, the threshold value of the second reference cell SRC00 is set within a range of 3.4 to 3.5 V.

Likewise, threshold value setting of the other two second reference cells SRC01 and SRC02 is executed. In this case, the target value of the threshold value of the first reference cell RFC01 is 4.5 V, and the target value of the threshold value of the first reference cell RFC02 is 5.5 V. Therefore, the threshold values of the second reference cells SRC01 and SRC02 are set within a range of 4.45 V±0.05 V and a range of 5.45 V±0.05 V, respectively.

The program method of these second reference cells SRC01 and SRC02 is similar to that of the first reference cell RFC00. It is to be noted that the control gate voltage during the write of the threshold value is higher than that of the second reference cell RFC00. The control gate voltage of the second reference cell RFC01 is 6.5 V, and the control gate voltage of the second reference cell RFC02 is 7.5 V.

Reference is next made to the threshold value setting of the first reference cells RFC00 through RFC1272 for use in reading the main array 2.

As shown in FIG. 6, there are 128×3 first reference cells in total from a first set of three first reference cells RFC00, RFC01 and RFC02 up to a 128-th set of three first reference cells RFC1270, RFC1271 and RFC1272. The threshold value setting of these first reference cells is executed by alternately executing write and verify.

That is, the 128 first reference cells RFC00, RFC10, RFC20, RFC30, ..., RFC1250, RFC1260 and RFC1270, of which the threshold value to be set is same, are first subjected to threshold value setting. The reason why the first reference cells of the same threshold value to be set are first subjected to write is that it is required to change the word line voltage applied to the control gates of the first reference cells in accordance with the threshold value to be adjusted.

If a program operation start signal is inputted to the program control circuit 1 in the sense amplifier and write circuit SAP00, then L (low) level is outputted as a write signal from the program control circuit 1 to the write circuit WC. If the data-on signal Dataon shown in FIG. 9 goes H level, then an L level signal is latched in the latch circuit LC. Then, the signal hhvp comes to have a high voltage (10 V, for example), and the output signal hvon of the level shifter HV comes to have a voltage of 10 V. The signal PGV come to have a program voltage (5 V, for example), and a PGrstart signal goes H level (10 V, for example), thereby turning on the NMOS transistor TrY and outputting a voltage of 5 V to the signal line ref00.

Further, the signal RC00 of FIG. 6 goes H level (10 V, for example), and an NMOS transistor Tr00 is turned on to output a voltage of 5 V to the drain of the first reference cell RFC00 from the signal line ref00. On the other hand, a voltage of, for example, about 5.5 V, which is lower than the voltage in the normal program stage, is applied to the reference word line $WL_R$. As a result, the program of the first reference cell RFC00 is started, and the threshold value of the first reference cell RFC00 rises. The program pulse width in this program stage was set at about 1 $\mu$sec.

The amount of increase in the threshold value of the first reference cell RFC00 due to the input of one pulse of this program pulse is the resolution of write. By setting the threshold value of the second reference cell SRC00 lower than the target value of the threshold value of the first reference cell RFC00 by the resolution of write, the threshold value of the first reference cell RFC00 can be set to the target value with the resolution accuracy of write.

This write (program) operation can be simultaneously executed for eight first reference cell RFC00 through reference cell RFC70 by, for example, eight sense amplifier and write circuits SAP00 through SAP70, and parallel write similar to that of the second embodiment can be achieved.

Next, the program control circuit 1 outputs an instruction of verify operation. As a result, the verify operation is started. During this verify operation, there are executed compare of threshold values by using the second reference cells SRC00 through SRC02, which have previously undergone threshold value adjustment, and the sense amplifier SAA of the sense amplifier and write circuits SAP00 through SAP1272.

During this compare of threshold values, a voltage is inputted from the drain of the second reference cell SRC00 to the inverted input terminal of the sense amplifier SAA of FIG. 9 via the transistor Trq3, the signal line rsen0, a transistor Tw00 and the signal line sen0. Moreover, a voltage is inputted from the drain of the first reference cell RFC00 to the noninverted input terminal of the sense amplifier SAA via the transistor Tr00 and the signal line ref00.

If the threshold value of the first reference cell RFC00 is lower than that of the second reference cell SRC00 as a result of compare of threshold values, then the voltage inputted to the noninverted input terminal of the sense amplifier SAA becomes lower than the voltage inputted to the inverted input terminal. In this case, the program control circuit 1, which receives an output signal from this sense amplifier SAA, determines that the threshold value of the first reference cell RFC00 is lower than the threshold value of the second reference cell SRC00 and applies again one pulse of the program pulse to this first reference cell SRC00. According to the above description, the threshold value of RFC00 among the eight first reference cells RFC00, RFC10, RFC20, RFC30, RFC40, RFC50, RFC60 and RFC70 is lower than the threshold value of the second reference cell SRC00. The program pulse is to be applied again by one pulse only to the first reference cells of the threshold value lower than the threshold value of the second reference cell SRC00 among the eight first reference cells RFC00 through RFC70.

If the compare of threshold values and the program pulse application are repeated and the program control circuit 1 finally determines that all of the eight first reference cells RFC00 through RFC70 have a threshold value higher than that of the second reference cell SRC00 (i.e., a current flows less than through the second reference cell), then the program pulse application is ended by the program control circuit 1.

A series of these operations is automatically executed by using the internal program control circuit 1 until the threshold value becomes equal to or higher than the predetermined threshold value if the command is once issued.

Subsequently, the threshold value adjustment is executed for the second reference cells, of which the threshold level to be set is same, in groups of eight in the order of first reference cell RFC80 through first reference cell RFC150, ..., first reference cell RFC1200 through first reference cell RFC1270.

Further, threshold value adjustment is executed similarly to the aforementioned manner for the 128 first reference cell RFC01 through the reference cell RFC1271, of which the threshold level to be set is higher than that of the 128 first reference cells RFC00 through 1270. In this case, in order to adjust the write speed, the voltage applied to the word line $WL_R$ during write is set at 6.5 V.

Subsequently, threshold value adjustment is executed similarly to the aforementioned manner for the 128 first reference cell RFC02 through the reference cell RFC1272, of which the threshold level to be set is higher. In this case, in order to adjust the write speed, the voltage applied to the word line $WL_R$ during write is set at 7.5 V.

In this third embodiment, assuming that the number of program pulses is 100, a time of 10 $\mu$sec is required for the program pulse applying operation (including setup operation and so on) and a time of 2 $\mu$sec is required for the verify during the threshold value setting of one first reference cell, then a time T required for the threshold value adjustment operation of one first reference cell becomes about 1.2 msec as calculated by the following equation (5).

$$T=((12)\ \mu sec \times 100)=1.2\ msec \qquad (5)$$

Moreover, in order to adjust one first reference cell, a command is first issued once. Assuming that a time required for this is 1 $\mu$sec, since there are 128×3 first reference cells in total and eight first reference cells can be subjected to simultaneous write, then a total time TT required for the threshold value adjustment becomes 0.117 sec as calculated by the following equation (6).

$$TT=1.201\ msec \times 128 \times 3/8=0.117\ sec \qquad (6)$$

As described above, according to this third embodiment, threshold value adjustment of the multivalued reference cells can be achieved within a realistic testing time of about 0.1 sec.

In the third embodiment, the four-valued flash memory as a nonvolatile semiconductor memory device has been described. However, without being limited to the four-valued flash memory, this invention can be applied to a nonvolatile semiconductor memory device in which electric charge states of three or more values are formed in the floating gate. Moreover, in the first through third embodiments, the compare of threshold values has been executed by the sense amplifier. However, it is acceptable to adopt a voltage comparator circuit capable of comparing the threshold value of the first reference cell with the threshold value of the second reference cell in place of the sense amplifier.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A nonvolatile semiconductor memory device provided with a memory cell constructed of a floating-gate field-effect transistor, which has a control gate, a drain, a source and a floating gate and is able to electrically execute write and erase of information, and a read device, which has a first reference cell, the device comprising:

a second reference cell;

a threshold value comparing device for comparing a threshold value of the first reference cell with a threshold value of the second reference cell; and a threshold value setting device for setting the threshold value of the first reference cell based on a result of comparing the threshold value of the first reference cell with the threshold value of the second reference cell by the threshold value comparing device, wherein the read device has the first reference cell and a first sense amplifier and reads the memory cell by using the first reference cell and the first sense amplifier, and the threshold value comparing device has a second sense amplifier and compares the threshold value of the first reference cell with the threshold value of the second reference cell by means of the second sense amplifier.

2. A nonvolatile semiconductor memory device provided with a memory cell constructed of a floating-gate field-effect transistor, which has a control gate, a drain, a source and a floating gate and is able to electrically execute write and erase of information, and a read device, which has a first reference cell, the device comprising:

a second reference cell;

a threshold value comparing device for comparing a threshold value of the first reference cell with a threshold value of the second reference cell; and a threshold value setting device for setting the threshold value of the first reference cell based on a result of comparing the threshold value of the first reference cell with the threshold value of the second reference cell by the threshold value comparing device, wherein the read device has the first reference cell and a sense amplifier and reads the memory cell by using the first reference cell and the sense amplifier, and the threshold value comparing device shares the sense amplifier owned by the read device as a sense amplifier for comparing the threshold value of the first reference cell with the threshold value of the second reference cell.

3. The nonvolatile semiconductor memory device as claimed in claim 1, further comprising:

a plurality of second reference cells of different threshold values.

4. A nonvolatile semiconductor memory device provided with a memory cell constructed of a floating-gate field-effect transistor, which has a control gate, a drain, a source and a floating gate and is able to electrically execute write and erase of information, and a read means, which has a first reference cell, the device comprising:

a second reference cell;

a threshold value comparing means for comparing a threshold value of the first reference cell with a threshold value of the second reference cell; and a threshold value setting means for setting the threshold value of the first reference cell on the basis of a result of comparing the threshold value of the first reference cell with the threshold value of the second reference cell by the threshold value comparing means, wherein if electrons are injected into the floating gate of the memory cell, a state in which the threshold value of the memory cell is raised is assumed to be a written state, and a state in which the threshold value of the memory cell is low is assumed to be an erased state, then a target value of the threshold value of the first reference cell is intermediate between the threshold value in the written state and the threshold value in the erased state, and the threshold value of the second reference cell is lower than the target value of the threshold value of the first reference cell.

5. The nonvolatile semiconductor memory device as claimed in claim 1, wherein the threshold value of the second reference cell is lower than the target value of the threshold value of the first reference cell by a resolution of write of the threshold value setting device.

6. The nonvolatile semiconductor memory device as claimed in claim 1, wherein the threshold value setting device comprises:

an internal control device for adjusting the threshold value of the first reference cell.

* * * * *